US012571978B2

(12) United States Patent
Aljumaily et al.

(10) Patent No.: US 12,571,978 B2
(45) Date of Patent: Mar. 10, 2026

(54) INTERFERENCE FILTER WITH MINIMAL ANGULAR AND THERMAL DEPENDENCE

(71) Applicant: Omega Optical LLC, Brattleboro, VT (US)

(72) Inventors: Ghanim Aljumaily, Allen, TX (US); John B. Barton, Dummerston, VT (US); Gary E. Carver, Wilmington, VT (US); Sheetal K. Chanda, Swanzey, NH (US); Sarah A. Locknar, Woodstock, VT (US)

( * ) Notice: Subject to any disclaimer, the term of this patent is extended or adjusted under 35 U.S.C. 154(b) by 651 days.

(21) Appl. No.: 17/963,315

(22) Filed: Oct. 11, 2022

(65) Prior Publication Data

US 2024/0118512 A1     Apr. 11, 2024

(51) Int. Cl.
| | |
|---|---|
| *G02B 5/20* | (2006.01) |
| *C23C 14/08* | (2006.01) |
| *C23C 14/14* | (2006.01) |
| *C23C 14/34* | (2006.01) |
| *C23C 14/58* | (2006.01) |
| *G01S 7/481* | (2006.01) |
| *G01S 17/931* | (2020.01) |
| *G02B 5/28* | (2006.01) |
| *G02B 7/00* | (2021.01) |

(52) U.S. Cl.
CPC ............ *G02B 7/008* (2013.01); *C23C 14/083* (2013.01); *C23C 14/14* (2013.01); *C23C 14/34* (2013.01); *C23C 14/5806* (2013.01); *G01S 7/4816* (2013.01); *G01S 17/931* (2020.01); *G02B 5/207* (2013.01); *G02B 5/288* (2013.01)

(58) Field of Classification Search
CPC ........ G02B 7/008; G02B 5/207; G02B 5/288; C23C 14/083; C23C 14/14; C23C 14/34; C23C 14/5806; C23C 14/185; C23C 14/205; C23C 14/541; G01S 7/4816; G01S 17/931
See application file for complete search history.

(56) References Cited

U.S. PATENT DOCUMENTS

| | | | | |
|---|---|---|---|---|
| 2001/0030810 A1* | 10/2001 | Gaebe | .................... | G02B 5/281 |
| | | | | 398/79 |
| 2002/0180956 A1* | 12/2002 | Barker | .................. | G01S 7/4915 |
| | | | | 356/121 |
| 2003/0012961 A1* | 1/2003 | Goto | .................. | C03C 10/0045 |
| | | | | 428/426 |
| 2003/0151817 A1* | 8/2003 | Gordon | .............. | G02B 6/29358 |
| | | | | 359/578 |
| 2004/0202869 A1* | 10/2004 | Goto | ........................ | C03C 4/08 |
| | | | | 501/55 |

(Continued)

*Primary Examiner* — Bumsuk Won
*Assistant Examiner* — John Curtis Sipes
(74) *Attorney, Agent, or Firm* — Jonathan B. David

(57) ABSTRACT

A method includes positioning a substrate at an initial position. The method also includes placing a filter onto the substrate. The filter is configured with a first set of layers with a maximized index and a second set of layers with a maximized index. The index for the first set of layers is greater than the index for the second set of layers. The filter has a reduced/minimal dependence on an angle of incidence (AOI) and reduced/minimal thermal dependence. The filter transmits signal photons onto a photon detector, rejects ambient photons, and increases signal-to-noise ratio of the photon detector.

18 Claims, 13 Drawing Sheets

(56)    References Cited

U.S. PATENT DOCUMENTS

| 2005/0094699 A1* | 5/2005 | Lunt ................... | G02B 26/001 |
| | | | 372/92 |
| 2011/0266441 A1* | 11/2011 | Fagan, III ............ | H10F 39/806 |
| | | | 257/E31.127 |
| 2015/0279561 A1* | 10/2015 | Hamm ................. | H01G 4/008 |
| | | | 427/125 |
| 2019/0019899 A1* | 1/2019 | Wang ................... | H10F 77/122 |
| 2019/0132572 A1* | 5/2019 | Shen ................... | G01S 7/4811 |
| 2019/0196072 A1* | 6/2019 | Hendrix ............... | G02B 5/285 |
| 2022/0120950 A1* | 4/2022 | Chen ................... | G02B 5/281 |
| 2022/0365263 A1* | 11/2022 | Houck ................ | G02B 5/0875 |
| 2022/0381962 A1* | 12/2022 | Sahara ................. | G02B 5/285 |
| 2023/0106382 A1* | 4/2023 | Crouse ................. | G02B 1/002 |
| | | | 359/359 |
| 2024/0069262 A1* | 2/2024 | Yang ................... | G02B 5/281 |

* cited by examiner

INTERFERENCE FILTER WITH MINIMAL ANGULAR AND THERMAL DEPENDENCE

TECHNICAL FIELD

The present disclosure generally relates to an interference filter with minimal angular and thermal dependence.

BACKGROUND

Self-driving cars are guided by Lidar technologies. Time-of-flight (TOF) sensing is a key Lidar technology for detecting the location and velocity of objects. During TOF sensing, the car can emit a laser pulse, which is reflected back by one or more objects.

Current existing interference filters enable many solar photons to be transmitted through the interference filter and onto detectors within the self-driving car. Single photon detection is also used to detect weak reflections from significant distances.

When solar photons are transmitted through the interference filter, the signal-to-noise ratio that is received by the photon detector is not at an acceptable level. The solar photons can be mixed in with the laser photons.

A need exists to have an interference filter that will minimize the number of transmitted solar photons, and have a high transmission of the laser photons. Further, the interference filter needs to have layers that will enable the interference filter to transmit only the desired photons over many angles-of-incidence and a large range of temperature. These attributes are also important for applications of interference filters in remote sensing, free space communications, and drone surveillance.

SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract as a whole.

The aforementioned aspects and other objectives can now be achieved as described herein.

In an embodiment, a method includes positioning a substrate at an initial position. The method also includes placing a filter onto the substrate. The filter is configured with a first set of layers with a maximized index and a second set of layers with a maximized index. The index for the first set of layers is greater than the index for the second set of layers. The filter has a reduced/minimal dependence on an angle of incidence (AOI) and reduced/minimal thermal dependence. The filter transmits signal photons onto a photon detector, minimizes the transmission of ambient photons, and increases the signal-to-noise ratio of the photon detector.

Amorphous germanium or amorphous silicon are provided as layers within the filter to enable the filter to have a reduced dependence on the AOI.

The method also includes placing amorphous silicon or hydrogenated amorphous silicon layers within one of more of the plurality of layers within the filter.

The method further comprises providing amorphous silicon-germanium alloy or hydrogenated amorphous silicon-germanium alloy layers within one or more of the plurality of layers.

The method also includes placing niobium oxide or titanium oxide layers within the lower index set of layers.

In an embodiment, a method includes positioning a substrate at an initial position. The method also includes configuring a filter with a plurality of layers onto the substrate. The plurality of layers have a maximized index. One set of the plurality of layers have a greater index than another set of the layers. The filter has a minimal dependence on an angle of incidence (AOI) and a minimal thermal dependence. The filter is configured to transmit signal photons to a photon detector and minimize the transmission of ambient photons and increase the signal to noise ratio of a photon detector. The method also includes transmitting a filtered signal from the filter toward one or more electronic devices.

The method also includes increasing optical thickness in the filter with reduced temperature and decreasing the optical thickness in the filter with increased temperature to provide the reduced thermal dependence.

In an embodiment, a system includes a substrate positioned at an initial position. The system also includes a filter configured onto the substrate. The filter is configured with a first set of layers with a maximized index and a second set of layers with a maximized index. The index for the first set of layers is greater than the index for the second set of layers. The filter has a reduced/minimal dependence on an angle of incidence (AOI) and reduced/minimal thermal dependence. The filter transmits signal photons, minimizes the transmission of ambient photons, and increases a signal-to-noise ratio. The system also includes a photon detector that receives a filtered signal from the filter.

The thickness of the filter is increased or decreased to reduce the thermal dependence of the filter.

BRIEF DESCRIPTION OF THE FIGURES

The accompanying figures, in which like reference numerals refer to identical or functionally similar elements throughout the separate views and which are incorporated in and form a part of the specification, further illustrate the present invention and, together with the detailed description of the invention, serve to explain the principles of the present invention.

Figure 1:
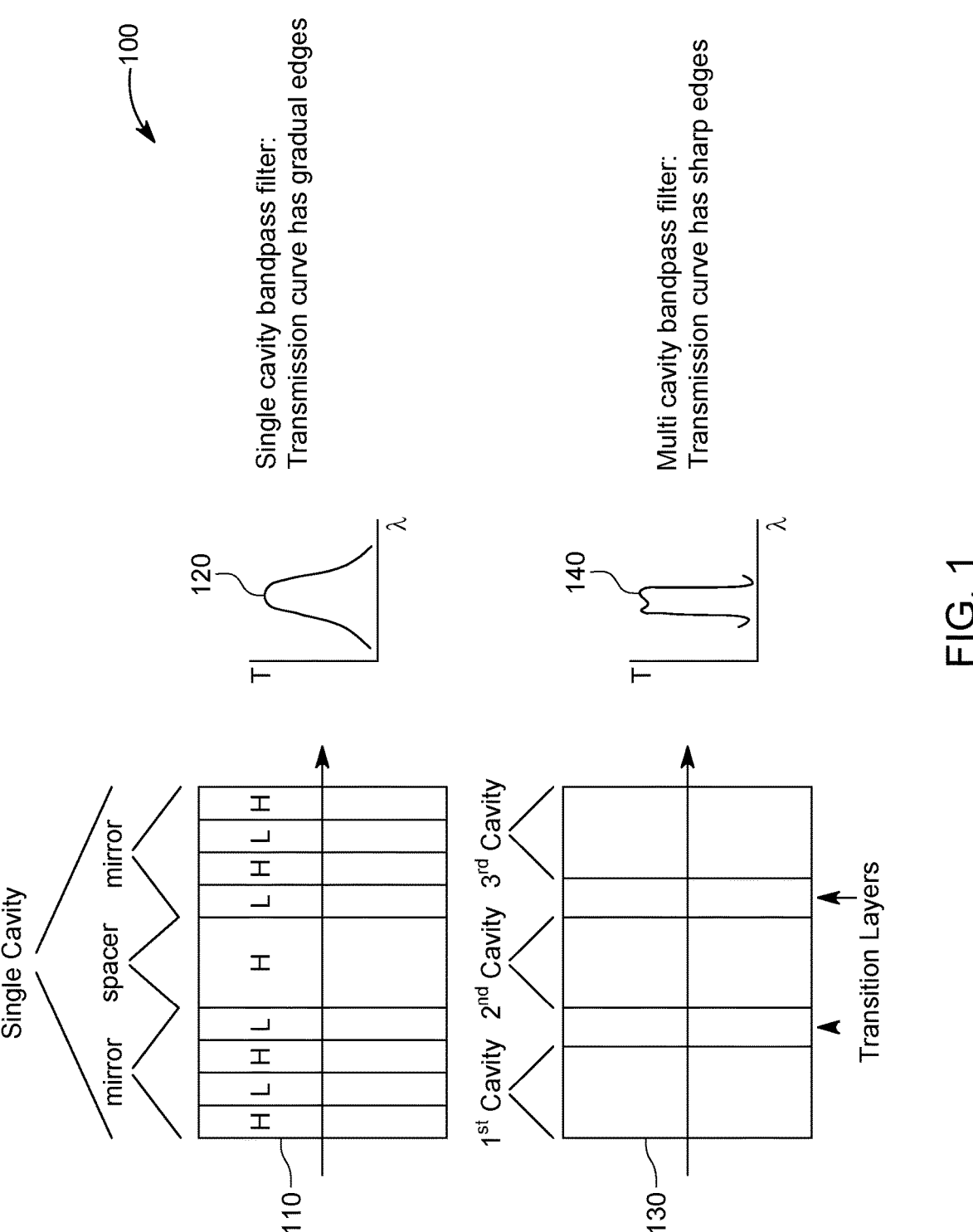
FIG. 1 illustrates band-pass filter designs in accordance with an embodiment of the invention.

Unless otherwise indicated illustrations in the figures are not necessarily drawn to scale.

DETAILED DESCRIPTION OF SOME EMBODIMENTS

Introduction and Context

The particular values and configurations discussed in these non-limiting examples can be varied and are cited merely to illustrate one or more embodiments and are not intended to limit the scope thereof.

Subject matter will now be described more fully herein after with reference to the accompanying drawings, which form a part hereof, and which show, by way of illustration, specific example embodiments. Subject matter may, however, be embodied in a variety of different form and, therefore, covered or claimed subject matter is intended to be construed as not being limited to any example embodiments set forth herein, example embodiments are provided merely to be illustrative. Likewise, a reasonably broad scope for claimed or covered subject matter is intended. Among other issues, subject matter may be embodied as methods, devices, components, or systems. The followed detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as a "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

One having ordinary skill in the relevant art will readily recognize the subject matter disclosed herein can be practiced without one or more of the specific details or with other methods. In other instances, well-known structures or operations are not shown in detail to avoid obscuring certain aspects. This disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Unless defined otherwise, all technical and scientific terms used herein have the same meanings as commonly understood by one of ordinary skill in the art to which the disclosed embodiments belong. Preferred methods, techniques, devices, and materials are described, although any methods, techniques, devices, or materials similar or equivalent to those described herein may be used in the practice or testing of the present invention.

Although claims have been included in this application to specific enumerated combinations of features, it should be understood the scope of the present disclosure also includes any novel feature or any novel combination of features disclosed herein.

References "an embodiment," "example embodiment," "various embodiments," "some embodiments," etc., may indicate that the embodiment(s) so described may include a particular feature, structure, or characteristic, but not every possible embodiment necessarily includes that particular feature, structure, or characteristic.

Headings provided are for convenience and are not to be taken as limiting the present disclosure in any way.

Each term utilized herein is to be given its broadest interpretation given the context in which that term is utilized.

Terminology

The following paragraphs provide context for terms found in the present disclosure (including the claims):

The transitional term "comprising", which is synonymous with "including," "containing," or "characterized by," is inclusive or open-ended and does not exclude additional, unrecited elements or method steps. See, e.g., *Mars Inc*. v. *H. J. Heinz Co.,* 377 F.3d 1369, 1376, 71 USPQ2d 1837, 1843 (Fed. Cir. 2004) ("[L]ike the term 'comprising,' the terms 'containing' and 'mixture' are open-ended."). "Configured to" or "operable for" is used to connote structure by indicating that the mechanisms/units/components include structure that performs the task or tasks during operation. "Configured to" may include adapting a manufacturing process to fabricate components that are adapted to implement or perform one or more tasks.

"Based On." As used herein, this term is used to describe factors that affect a determination without otherwise precluding other or additional factors that may affect that determination. More particularly, such a determination may be solely "based on" those factors or based, at least in part, on those factors.

All terms of example language (e.g., including, without limitation, "such as", "like", "for example", "for instance", "similar to", etc.) are not exclusive of other examples and therefore mean "by way of example, and not limitation . . . ".

A description of an embodiment having components in communication with each other does not infer that all enumerated components are needed.

A commercial implementation in accordance with the scope and spirit of the present disclosure may be configured according to the needs of the particular application, whereby any function of the teachings related to any described embodiment of the present invention may be suitably changed by those skilled in the art.

The flowchart and block diagrams in the figures illustrate the architecture, functionality, and operation of possible implementations of systems and methods according to various embodiments. Functions noted in the block may occur out of the order noted in the figures. For example, two blocks shown in succession may, in fact, be executed substantially concurrently, or the blocks may sometimes be executed in the reverse order, depending upon the functionality involved.

Further, any sequence of steps that may be described does not necessarily indicate a condition that the steps be performed in that order. Some steps may be performed simultaneously.

The functionality and/or the features of a particular component may be alternatively embodied by one or more other devices that are not explicitly described as having such functionality/features. Also, various embodiments of the present invention need not include a device itself.

More specifically, as will be appreciated by one skilled in the art, aspects of the present invention may be embodied as a system and/or method.

Introduction

Embodiments of the present invention include a system with an interference filter that is designed to have a minimal dependence on angle of incidence (AOI) and minimal thermal dependence. The interference filter will be able to allow for a high transmission of laser photons, and will minimize the transmission of ambient (solar photons). To do so, the filter must exhibit a narrow spectral bandpass. As a result, the signal-to-noise ratio of the system will increase.

To enable the interference filter to have a minimal dependence based on the AOI, the interference filter will have high index layers to enable the interference filter to have a minimal AOI. Materials such as silicon and germanium will be used to mediate the AOI issue. The high index design options include germanium and silicon, and also hydrogenated amorphous silicon for both the high and low index layers to allow for high transmission at all AOI from zero to ten degrees. Both the high and low index layers will be configured within the interference filter. The high index layers will thereby enable the interference filter to enable high transmission of laser photons at AOI from zero to ten degrees, and thereby enable the interference filter to have a minimal dependence on the AOI.

The interference filter of the system will also have minimal thermal dependence. The interference filter will minimize the transmission of solar photons and enable laser photons to be transmitted through the interference filter. Layers under compressive stress can be positioned within the interference filter to enable the interference filter to have the minimal thermal dependence. The interference filter will be positioned on a substrate. When the combined substrate and interference filter are in use, the compression of the interference filter can be reduced. As a result, the reduced compressive stress lengthens the interference filter and reduces the thickness of the interference filter. The reduction in the filter's thickness due to stress relaxation counteracts the increase in optical thickness due to the thermally induced changes in index. Accordingly, stressed layers can enable the interference filter to behave in an athermal manner, and enable the interference filter to have a minimal thermal dependence. Further, the substrate will have a greater coefficient of thermal expansion (CTE) than the high and low index layers configured within the interference filter. The contrast in CTE will enable the interference filter to have minimal thermal dependence.

A self-driving car can emit a pulsed laser. The pulsed laser can eventually be emitted onto a target object. The target object can reflect the pulsed laser onto a receiver. The receiver can then send the pulsed laser onto the narrow band interference filter. The interference filter will have stressed layers and high index layers to ensure that the interference filter has a minimal thermal dependence and minimal AOI dependence. As a result, the interference filter will enable a high transmission of the laser photons from the pulsed laser and reject most of the ambient photons. A single photon detector within the self-driving car will receive the high transmission of laser photons. The signal-to-noise ratio within the system will increase as a result.

A free-space communication system can emit a pulsed laser. The pulsed laser can be detected by a receiver. The receiver can then send the pulsed laser onto the narrow band interference filter. The interference filter will have stressed layers and high index layers to ensure that the interference filter has a minimal thermal dependence and minimal AOI dependence. As a result, the interference filter will enable a high transmission of the laser photons from the pulsed laser and reject most of the ambient photons. A photon detector within the communication system will receive the high transmission of laser photons. The signal-to-noise ratio within the system will increase as a result.

A low-earth-orbit satellite or surveillance drone can receive ambient radiation. The radiation can be detected by a receiver. The receiver can send the radiation onto a narrow band interference filter that transmits key wavelengths of interest. The interference filter will have stressed layers and high index layers to ensure that the interference filter has a minimal thermal dependence and minimal AOI dependence. As a result, the interference filter will enable a high transmission of ambient light at the key wavelength of interest and reject other wavelengths. A photon detector within the satellite or drone will receive the high transmission of photons at the key wavelengths. The signal-to-noise ratio within the system will increase as a result.

System Structure

FIG. 1 illustrates a single cavity system 100. The system 100 will include a single cavity 110 with a mirror alternating with a spacer and another mirror. The mirror will include alternating high and low index layers. The second mirror also includes alternating low and high index layers. As such, a single cavity can include a mirror with low and high index layers, a spacer with a high index layer, and another mirror with alternating low and high index layers. The higher index layers will enable an interference filter to have a minimal dependence on the angle of incidence.

In FIG. 1, a transmission curve 120 is also shown. The transmission curve 120 has a gradual curve based on the single cavity 110 with the mirrors and spacer.

Referring to FIG. 1, multiple cavities 130 are shown. The multiple cavities include a first cavity, second cavity, and third cavity. Transition layers are positioned within the multiple cavities 130. A multi-cavity bandpass filter graph 140 is also shown. The transmission curve for the multi-cavity bandpass filter includes a transmission curve with sharp edges as opposed to the transmission curve 120 for the single cavity bandpass filter.

Figure 2:
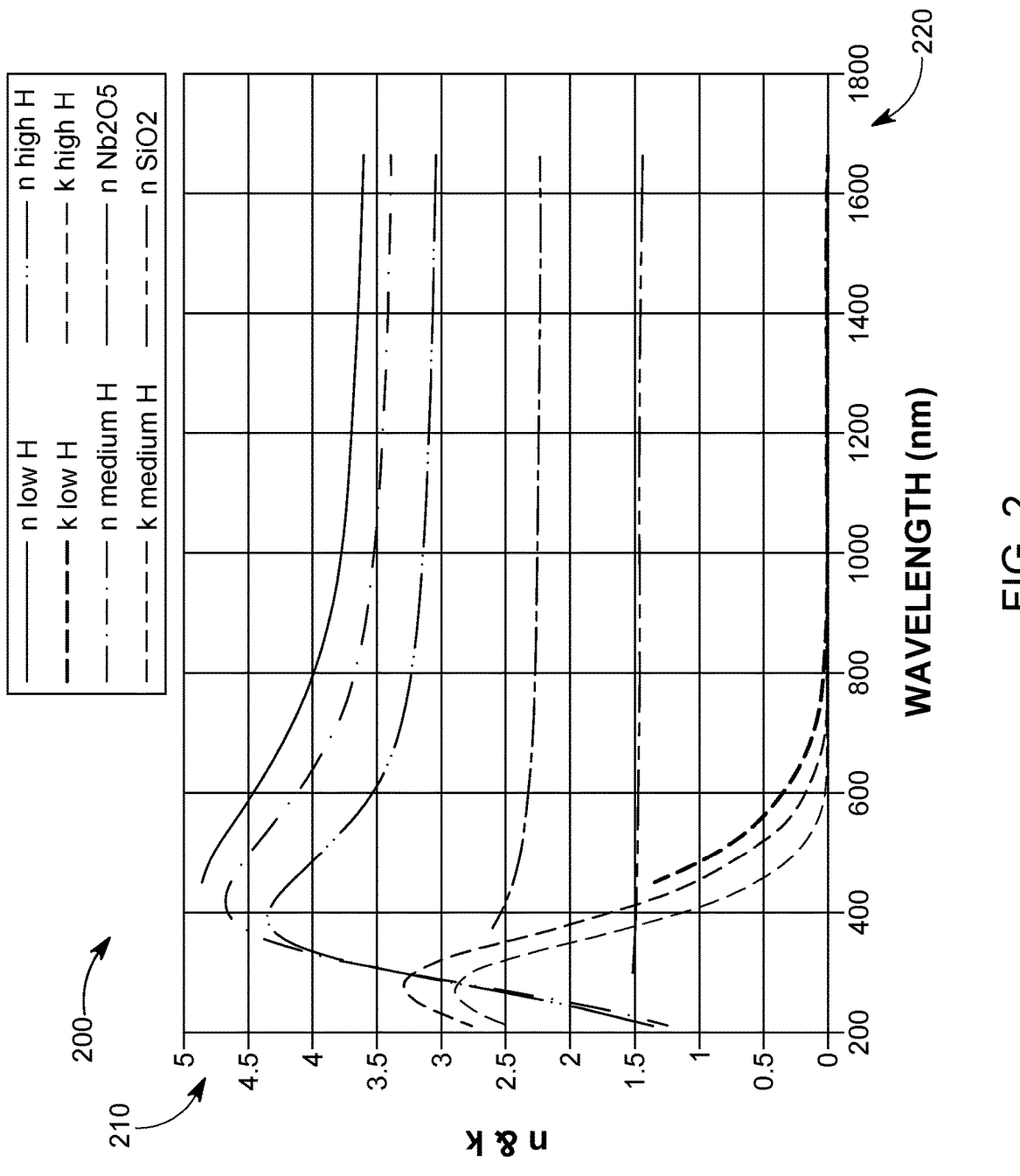
FIG. 2 illustrates optical indices of materials used in band-pass filters in accordance with the invention.
Figure 5:
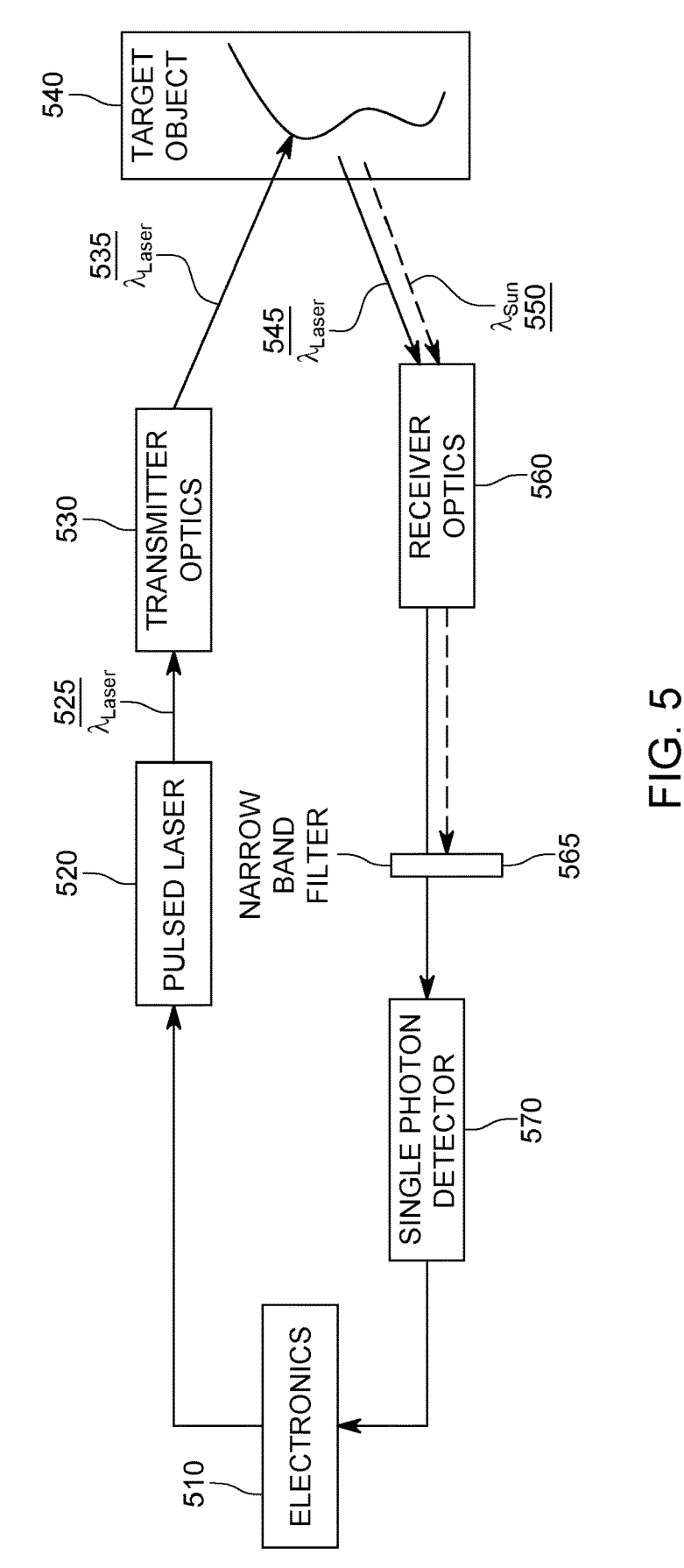
FIG. 5 illustrates application of a band-pass filter in a LIDAR system in accordance with an embodiment of the invention.

Referring to FIG. 2, a graph 200 of various index values is illustrated. The graph 200 illustrates the index values n and k 210 for various materials that are placed within the interference filter. The graph 200 includes curves for three versions of amorphous silicon (with low, medium, and high hydrogen doping) as well as curves for niobium oxide and silicon oxide. Interference filters such as the one in FIG. 5 are fabricated with stacks of high index and low index layers. A suitable contrast between n values of niobium oxide for the high index and silicon oxide for the low index are shown. Moreover, a delta value between niobium oxide and silicon oxide can be appropriate for the interference filter. However, the filter would have too much AOI dependence for many applications. As such, higher index semiconductors need to be used to lessen the AOI dependence. The higher index values will also include hydrogenated amorphous silicon. The interference filters with the higher index layer can mediate the blue shifts at high AOI. In addition, the hydrogen doping can also minimize k values in the near infrared spectral region. The materials with the higher index values will enable the interference filter to have a minimal dependence on the AOI. Higher n index values and lower k index values are needed to enable a minimal AOI dependence and higher transmission of laser photons. Accordingly, the materials such as hydrogenated amorphous silicon are placed within the interference filter to enable the interference filter to have the minimal dependence on the AOI.

In FIG. 2, the wavelength 220 for the various materials placed within the band/interference filter are shown as well. High index values n 210 and low index values k 210 are illustrated. The index of layers such as silicon oxide and niobium oxide are also shown. The higher index values n 210 enable the band filter to have a reduced/minimal dependence on the AOI, and the reduced values k 210 enable greater transmission of laser photons and an increased signal-to-noise ratio. As such, the graph 200 illustrates how the index materials with the higher n values and lower k values, when positioned within the narrow band interference filter, will enable the narrow band interference filter to have a minimal/reduced dependence on the AOI, and allow for greater transmission of the incoming laser photons.

Figure 3:
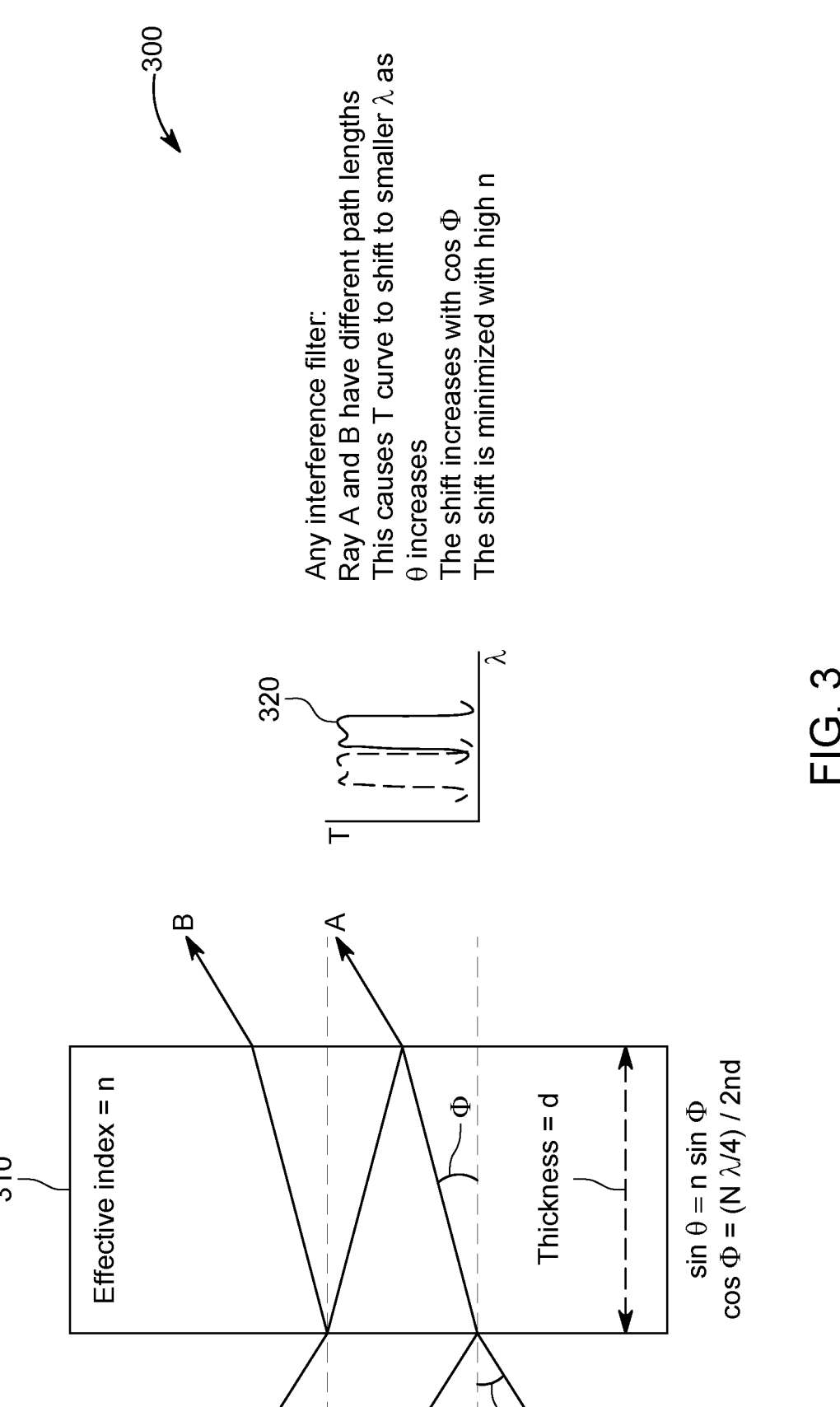
FIG. 3 illustrates how filters shift to smaller wavelengths with increasing angles-of-incidence in accordance with an embodiment of the invention.

With respect to FIG. 3, an interference filter system 300 is shown. The interference filter 310 is illustrated with an effective index. Rays A and B are also shown. An effective index n is shown as well as a thickness d. The Rays A and B have different path lengths through the interference filter 310. As the angle of incidence increases, the transmission will shift to a smaller wavelength as illustrated by the transmission curve 320. This shift is increased with a greater angle of incidence, and decreased with high index layers within the interference filter 310.

Figure 4:
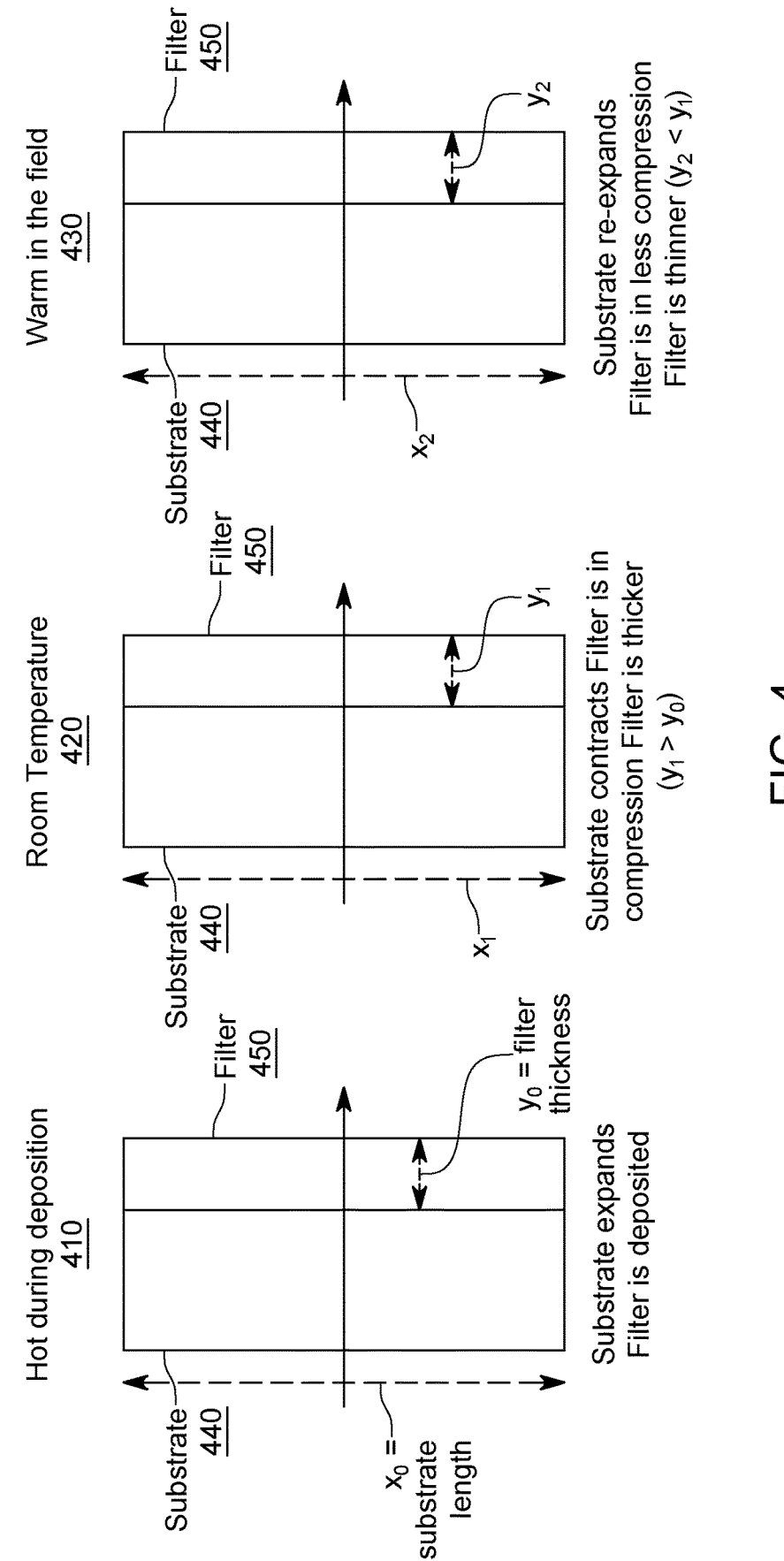
FIG. 4 depicts how filters can use stress to become athermal in accordance with an embodiment of the invention.

Referring to FIG. 4, a system 400 of the interference filter is shown. Moreover, within the system 400, filter is shown when it is hot during deposition 410, at room temperature 420, and at when the interference filter is warm in the field 430. A substrate 440 supports the interference filter 450.

In FIG. 4, while hot during deposition 410, the substrate 440 expands before the filter 450 is deposited. As such, the heat during this phase causes the substrate 440 to expand, wherein the filter is then deposited. Assuming the substrate CTE is greater than the filter CTE, During room temperature 420, the substrate 440 will contract the filter 450 (the filter is under compressive stress). During room temperature, the thickness $y_1$ of the filter is greater than the thickness $y_0$ during deposition 410. The length $x_1$ of the substrate 440 is smaller than during deposition 410. When the filter 450 is warm in the field 430, the substrate 440 re-expands. The filter 450 is in less compression, and thinner than during room temperature 420. As such, the filter thickness $y_2$ is less than $y_1$. It should be understood that the temperatures in FIG. 4 are examples. If the substrate CTE is higher than the filter CTE, the filter can still be athermal after deposition at multiple temperatures.

In FIG. 5, a practical application of the interference filter is shown within the system 500. The system 500 illustrates an electronics device 510 that controls the pulsed laser 520. The electronics device 510 can be installed within a self-driving car in one or more embodiments. The laser beam 525 from the pulsed laser 520 can travel to the transmitter optics 530. The laser beam 535 from the transmitter optics 530 is then incident on a target object 540. The laser beam 545 is reflected from the target object 540. The $\lambda_{laser\ beam}$ 545 is then incident on the receiver optics 560. The $\lambda_{laser\ beam}$ 545 represents laser photons that are incident on the receiver optics and provide a high signal-to-noise ratio. The $\lambda_{sun}$ 550 represents solar photons that are incident on the receiver optics 560. Both the $\lambda_{laser}$ 545 and the $\lambda_{sun}$ 550 are incident on the narrow band interference filter 565.

With respect to FIG. 5, materials of the substrate and the narrow band filter 565 enable the filter 565 to have reduced/minimal thermal dependence and reduced/minimal dependence on the angle of incidence (AOI). The materials of the narrow band filter 565 include high index materials that enable functional performance of a range of AOI and thermal conditions when deposited on carefully selected substrates. The narrow band interference filter 565 is configured to provide the reduced/minimal thermal dependence and reduced/minimal AOI.

Referring to FIG. 5, with respect to the AOI dependence, higher index materials such as silicon and germanium that can be placed within the narrow band interference filter 565 will enable the narrow band interference filter 565 to have reduced/minimal AOI dependence. Moreover, the index values n and k of the interference filter 565 will include higher index n values that are higher than niobium oxide and lower index k values lower than about 0.0005. The high index layers can include hydrogenated amorphous germanium, hydrogenated amorphous silicon-germanium alloys, hydrogenated amorphous silicon, amorphous silicon, amorphous germanium, and amorphous silicon-germanium. The low index layers can include hydrogenated amorphous silicon, niobium oxide, titanium oxide, and silicon oxide. Further, the index layers designed with the higher indices will have a low AOI dependence. Changes in the index and thickness of each layer of the interference filter 565 can shift the band of high transmission to both higher or lower wavelengths. With respect to hydrogenated germanium, the k values of hydrogenated germanium are too high for acceptable transmission at many wavelengths of interest, wherein the wavelengths of interest can be near the infrared/telecom bands. Layers with hydrogenated amorphous silicon for both the high and low index layers will allow for high transmission at all AOI from zero to ten degrees over a specified wavelength range.

Referring back to FIG. 2, different hydrogen flow rates will generate the higher and lower indices. Secondary ion mass spectroscopy (SIMS) profiles have shown that the hydrogen bonded to silicon in a given layer remains in that layer and does not diffuse into adjoining layers unless the filter is exposed to temperatures much above that expected in the field.

Referring again to FIG. 5, the thermal shift must be mitigated to retain the high transmission at the laser wavelength. The interference filter 565 can be thermally stabilized by depositing on a substrate with a specific CTE, wherein filters are usually deposited at elevated temperatures. If the substrate's CTE is larger than the filter's 565 CTE, the filter 565 will become compressed as the filter 565 cools after deposition. In contrast, as the filter 565 and substrate are warmed during use in the field, the compression of the filter 565 is thereby reduced. Moreover, the reduced compressive stress slightly lengthens the filter 565 and reduces the thickness of the filter 565. The reduction in thickness due to stress relaxation counteracts the increase in optical thickness due to the thermally induced changes in index. The significant difference in the CTE between the substrate and the oxide layers and semiconductor layers will enable the interference filter 565 to behave in an athermal manner and reject most of the solar photons and increase the signal-to-noise ratio. The significant difference in CTE between the substrate in comparison to the oxide and semiconductor layers allow the interference filter 565 to behave athermally.

Referring to FIG. 5, the interference filter 565 is comprised of materials such as the amorphous silicon-germanium alloy, and hydrogenated amorphous silicon layers to provide a reduced/minimal AOI dependence of the narrow band interference filter 565. Oxide layers can also be deposited as the low index material within the interference filter 565. The greater CTE of the substrate in relation to the oxide layers and semiconductor layers effectively minimize the thermal dependence of the interference filter 565. As a result an increase in the signal-to-noise ratio will occur and more $\lambda_{laser}$ 545 photons will be transmitted through the narrow band filter 565

Figure 6:
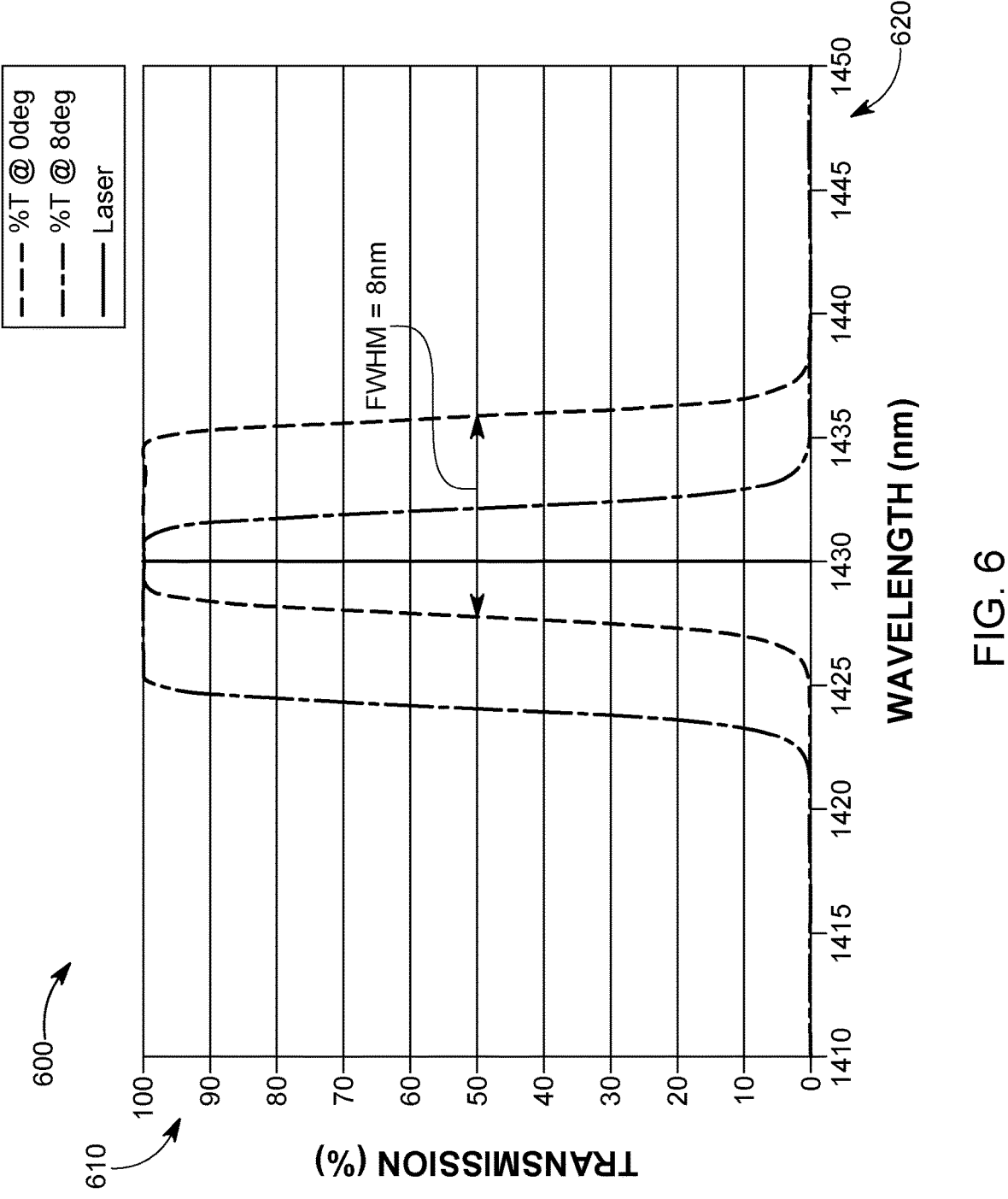
FIG. 6 depicts transmission versus wavelength at two angles-of-incidence of a typical band-pass filter with a FWHM of 8 nm in accordance with an embodiment of the invention.

In FIG. 6, a graph 600 of a transmission plot is shown. The transmission plot of the graph 600 illustrates the transmission 610 and wavelength 620. The graph 600 illustrates a typical band pass filter made of niobium oxide and silicon oxide, and a three cavity Fabry-Perot design. The graph 600 illustrates how a smaller wavelength with a higher AOI is evident. The full-wave-half-maximum (FWHM) must be large enough to provide a high transmission at the laser wavelength 620 over all AOI of interest.

Figure 7:
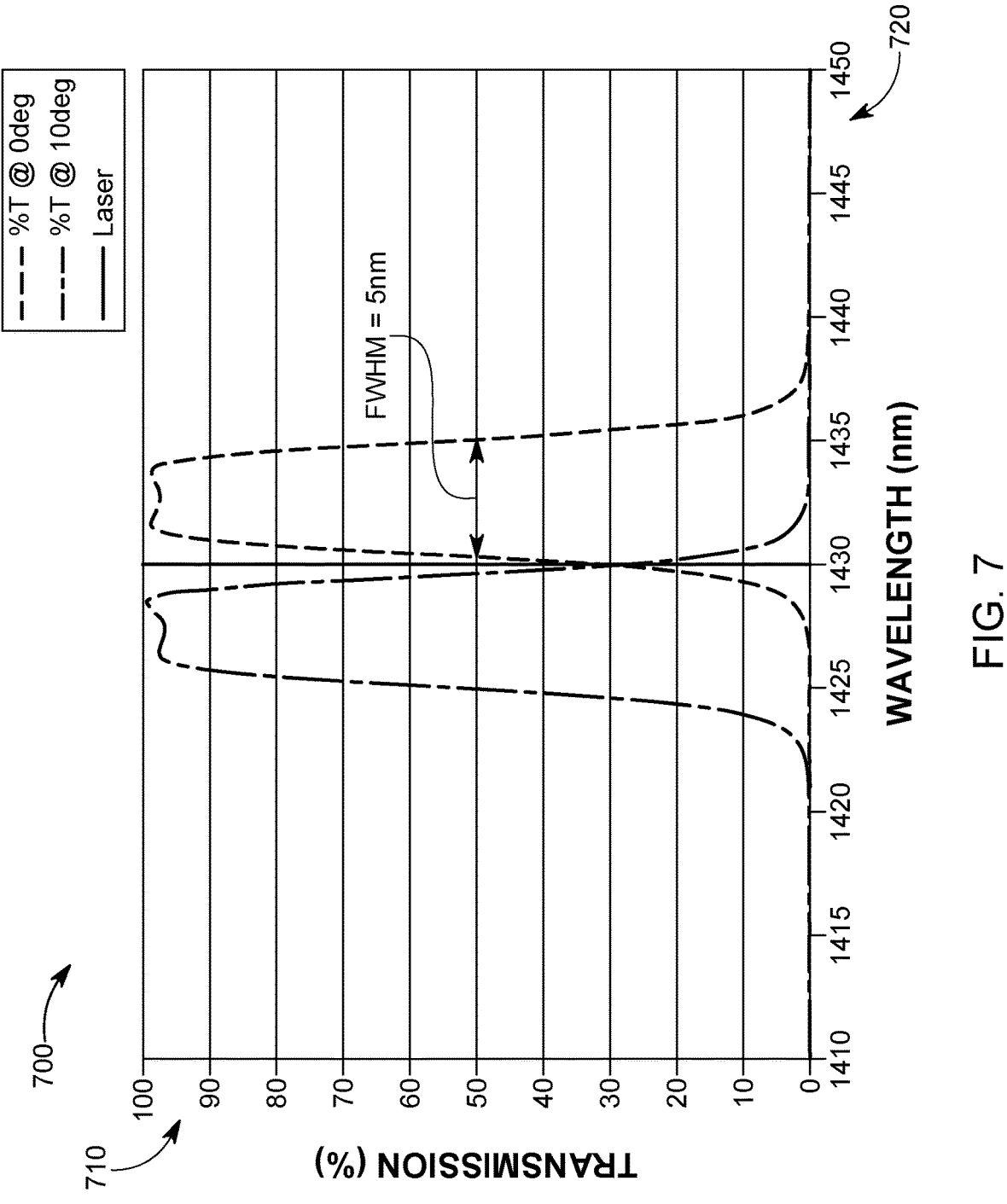
FIG. 7 illustrates transmission versus wavelength at two angles-of-incidence of a typical band-pass filter with a FWHM of 5 nm in accordance with an embodiment of the invention.

Referring to FIG. 7, another graph 700 illustrating the transmission 710 and wavelength 720 curves is shown. In this illustration, the graph 700 shows a smaller FWHM design with niobium oxide and silicon oxide will lead to severe transmission loss at the laser wavelength for AOI values that are near zero and ten degrees. Large FWHM designs allow considerable solar radiation to pass through the filter and reduce the signal-to-noise ratio. Moreover, higher index materials such as silicon and germanium can be used to mediate the AOI issue in many applications. As the index values k of hydrogenated germanium are too high for acceptable transmission at wavelengths of interest for TOF sensing, the highest index with low k would be an alloy of Germanium and Silicon.

Figure 8:
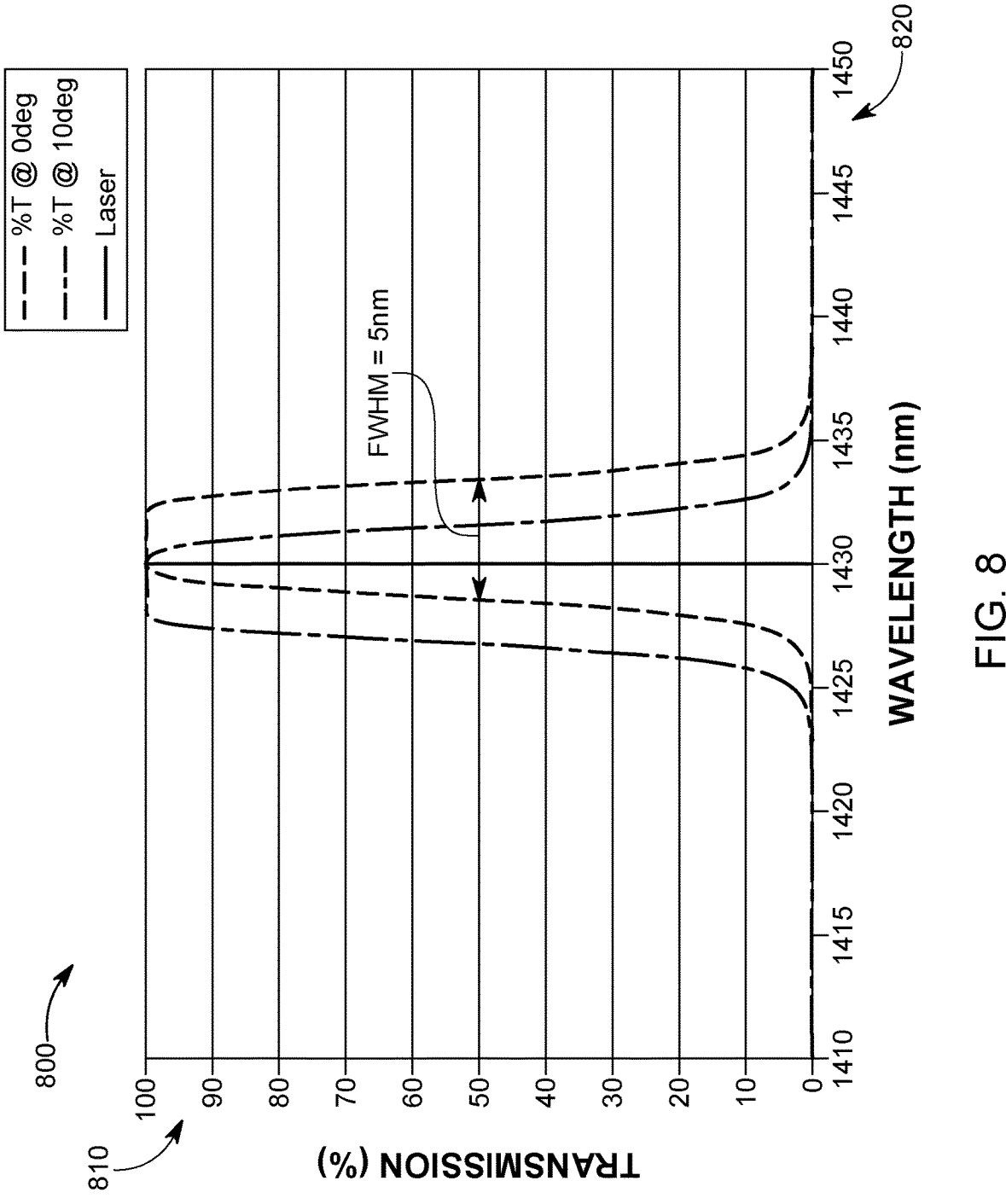
FIG. 8 depicts transmission versus wavelength at two angles-of-incidence of an ideal band-pass filter with a FWHM of 5 nm in accordance with an embodiment of the invention.

In FIG. 8, a Transmission/Wavelength Curve 800 illustrating transmission 810 and wavelength 820 with the highlighted FWHM equal to five nanometers is illustrated. The graph 800 illustrates a design that employs hydrogenated amorphous silicon for both the high and low index layers to allow for high transmission at all AOI from zero to ten degrees. Different hydrogen flow rates generate the higher and lower indices. In addition, secondary ion mass spectroscopy (SIMS) profiles have shown that the hydrogen bonded to silicon in a given layer remains in that layer and does not diffuse into adjoining layers unless the interference filter is exposed to temperatures that are far above the temperatures that are expected in typical applications. Although the designs based on hydrogenated silicon have a low AOI dependence, any thermally induced changes in the index and thickness of each layer within the interference filter can shift the band of high transmission to both higher and/or lower wavelengths.

Figure 9:
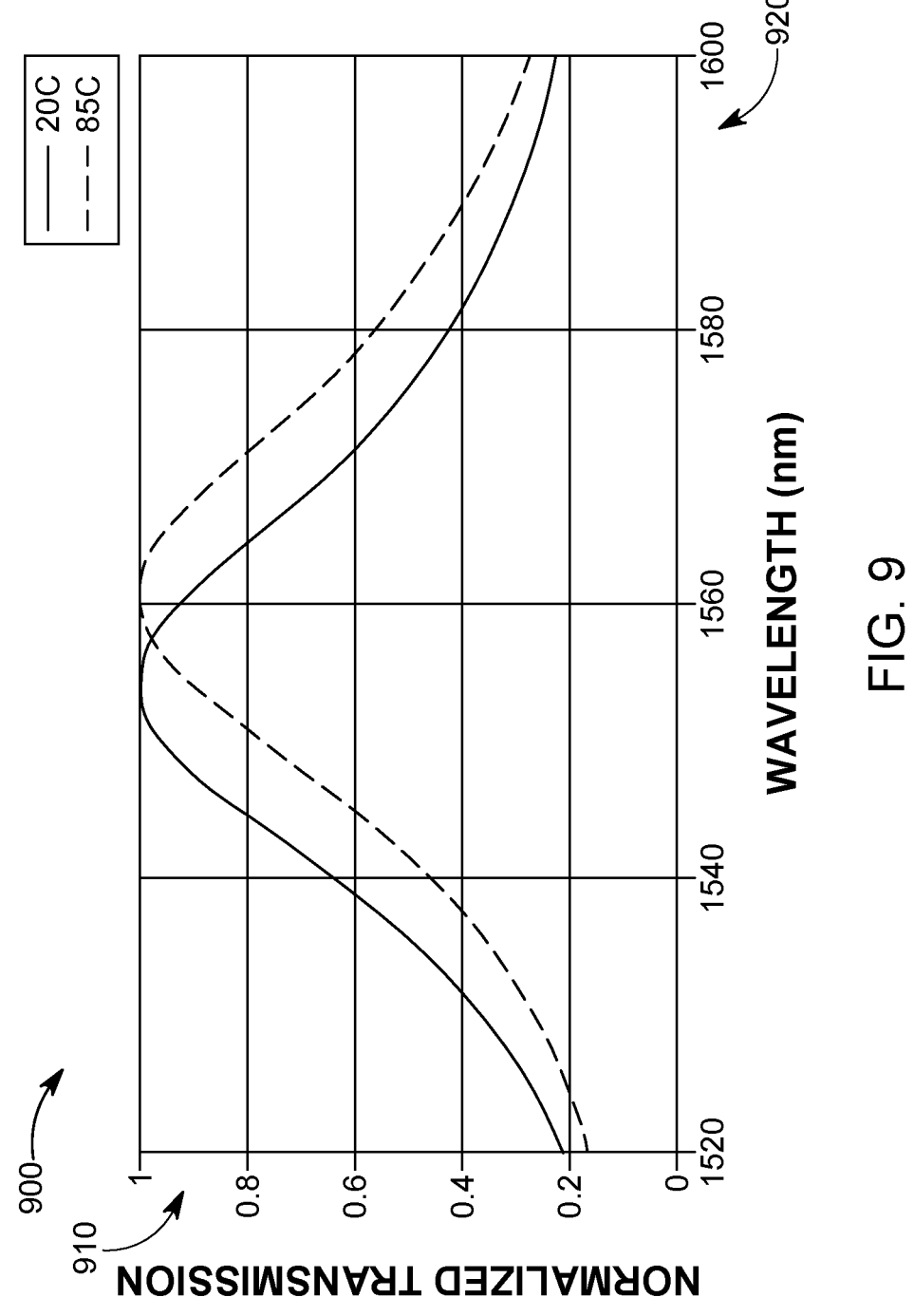
FIG. 9 illustrates transmission versus wavelength for a band-pass filter at two temperatures on a typical substrate in accordance with an embodiment of the invention.

Referring to FIG. 9, another graph 900 is shown. The graph 900 illustrates a normalized transmission 910 and wavelength 920. Curves for 85 degrees Celsius and 20 degrees Celsius are shown. The wavelength data 920 for a single cavity band pass filter made of hydrogenated silicon for the high index and niobium oxide for the low index on a glass substrate at the two temperatures is shown. As is shown by the graph 900, a significant shift toward a longer wavelength with a higher temperature is evident. Further, a similar shift to smaller wavelengths with lower temperature also occurs. These mentioned changes are driven by the thermal dependence of the index of refraction of the silicon and also the thermal coefficient of expansion of the layers. As such, the thermal shift has to be mitigated to retain the high transmission at the laser wavelength. The temperature range would generally be from −40 degrees Celsius to 80 degrees Celsius for TOF sensing in automobiles.

With respect to FIG. 9, interference filters are usually deposited at elevated temperatures. If the CTE for the substrate is larger than the CTE for the layers within the interference filter, then the interference filter will become compressed as the filter and substrate cool after deposition. In contrast, as the filter and substrate are warmed when in use, the compression of the interference filter is reduced. The reduced compressive stress slightly lengthens the filter and reduces the thickness of the filter. As such, the reduction in thickness due to the stress relaxation counteracts the increase in optical thickens (the product of index and physical thickness) due to the thermally induced charges in index and thickness. The greater CTE of the substrate in comparison to the CTE of the oxide and semiconductor layers will enable the interference filter to behave in an athermal manner and reduce its thermal dependence. The contrast in the CTE of the substrate in comparison to the CTE of the oxide layer or semiconductor layer enables the interference filter to have a minimal thermal dependence.

With respect to FIG. 9, the CTE values for typical oxides, crystalline silicon, and amorphous silicon are shown:

| Material | dn/dT | CTE |
|---|---|---|
| Oxides | ~1.8E−5/C | 1-2 ppm/C |
| Silicon | 1.8E−4/C | 2.6 ppm/C |
| Amorphous Silicon | 3.85E−4/C | 1.4 ppm/C |

With reference to FIG. 9, as shown in the table above, compared to typical oxides, amorphous semiconductors (silicon) have a similar CTE but much higher changes of the index with temperature (dn/dT). As temperature increases, the stress relaxation described above decreases the physical thickness to compensate for the increase in the index of the semiconductor to keep the optical thickness constant.

Figure 10:
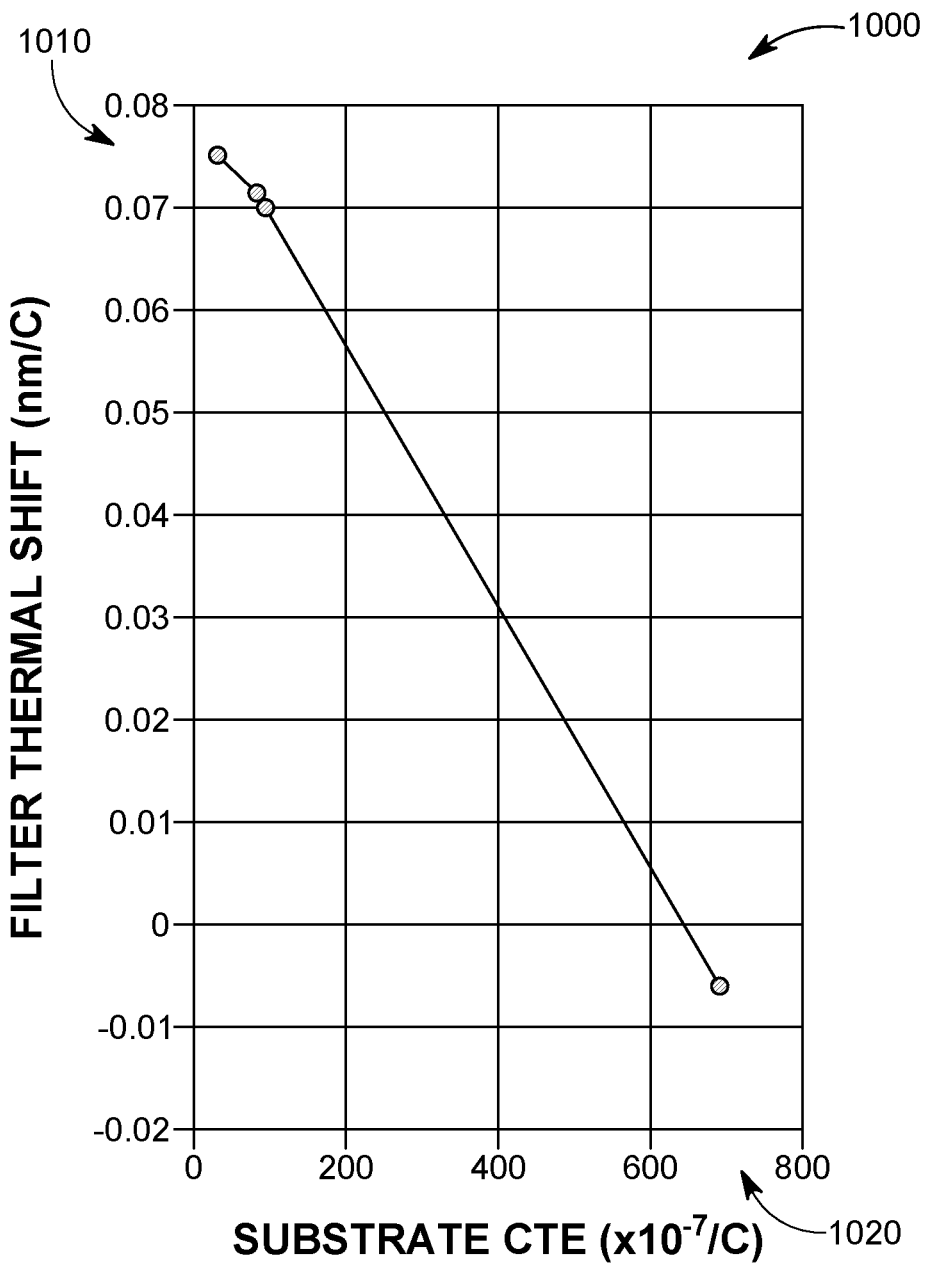
FIG. 10 depicts how band-pass filters shift with temperature as a function of substrate CTE in accordance with an embodiment of the invention.

Referring to FIG. 10, a graph 1000 is illustrated showing a filter thermal shift 1010 and substrate CTE 1020. The horizontal axis corresponds to substrates composed of a few classes, including glass, fused silica, and various polymeric materials. As such the intersection of the curve on the graph 1000 with the abscissa indicates that the CTE of a substrate at that intersection point would make the interference filter completely athermal or have minimum thermal dependency. As such, the laser photons would be transmitted through the interference filter with a small FWHM at many temperatures. Moreover, athermal interference filters composed of semiconductor materials require a substrate with much higher CTE than other interference filters composed of oxide materials. Referring to the graph 1000, a given polymeric substrate has the highest point within the graph 1000. The point in the graph 1000 with the highest CTE will be nearly athermal.

Figure 11:
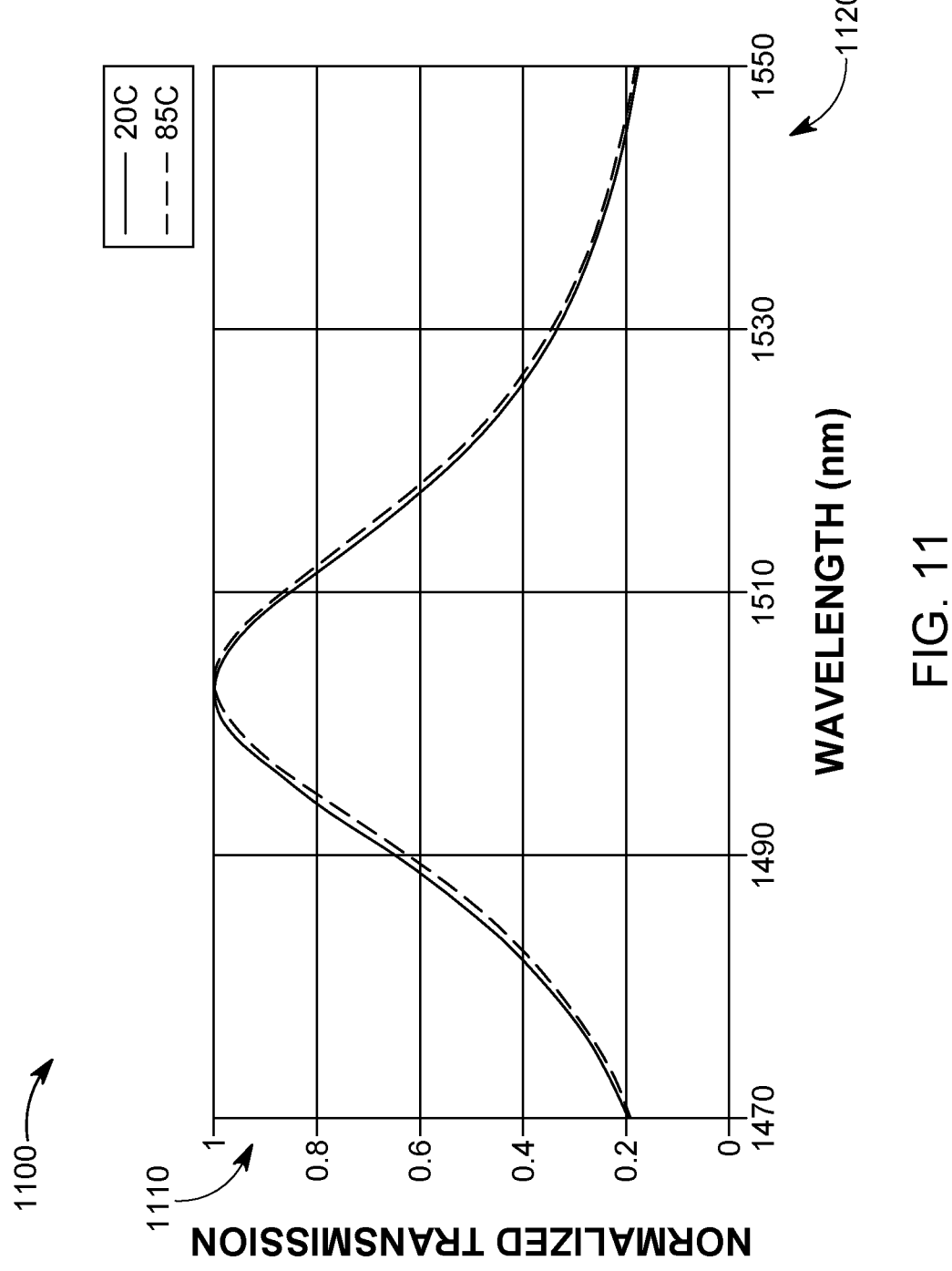
FIG. 11 illustrates transmission versus wavelength for a band-pass filter at two temperatures on an ideal substrate in accordance with an embodiment of the invention.

Referring to FIG. 11, a graph 1100 is illustrated with normalized transmission 1110 and wavelength 1120. Moreover, the graph 1100 illustrates normalized transmission 1110 and wavelength 1120 for a single cavity filter composed of silicon/niobium oxide deposited on a polymeric substrate. The impact of the polymeric substrate is observed by comparing the thermal shifts in the graph 1110 and also the graph 900 shown in FIG. 9.

Figure 12:
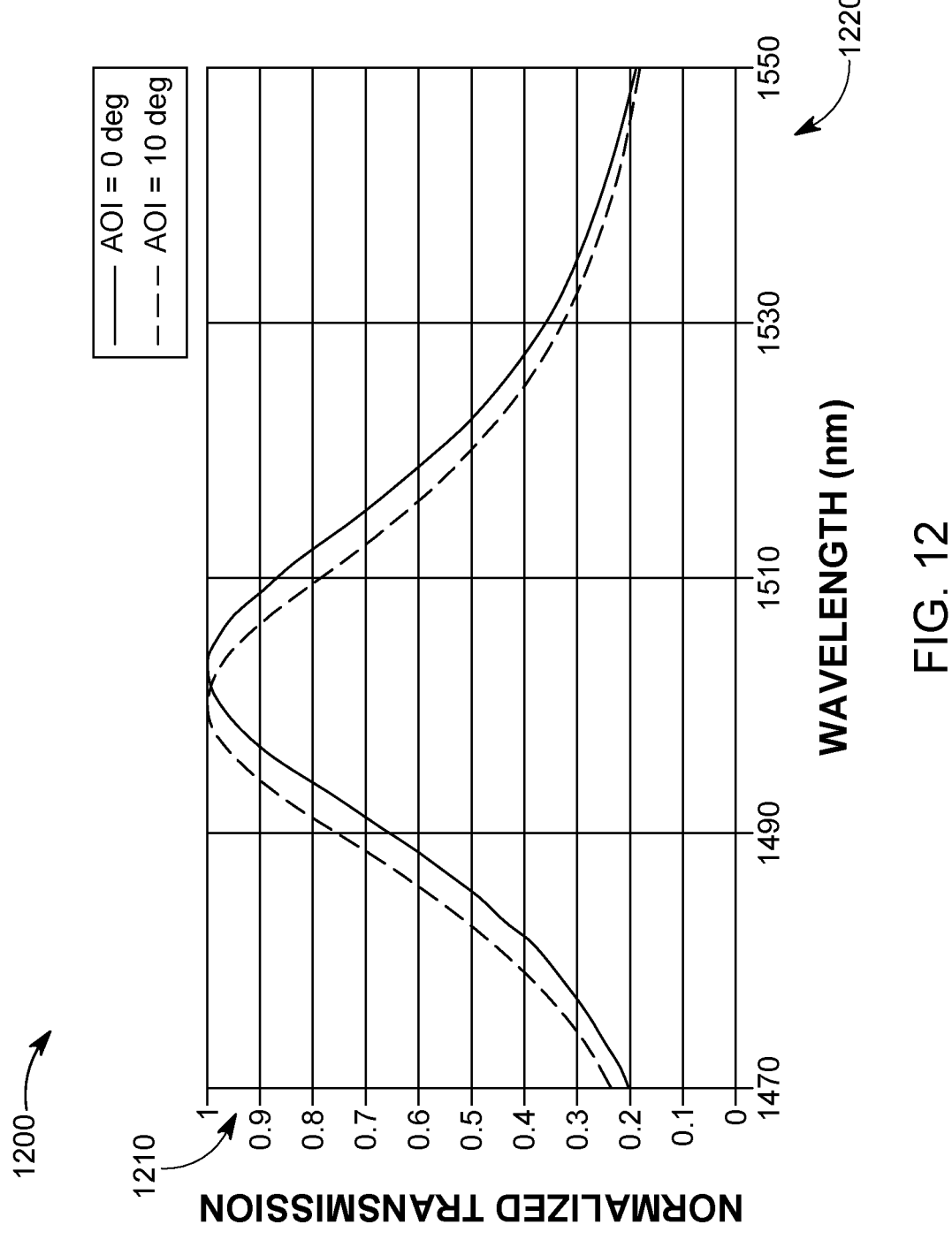
FIG. 12 depicts transmission versus wavelength for a band-pass filter at two angles-of-incidence on an ideal substrate in accordance with an embodiment of the invention.

In FIG. 12, a graph 1200 is also illustrated with a normalized transmission 1210 and AOI/wavelength 1220. The high indices of the silicon/niobium oxide stack minimizes the AOI dependence. Although not shown, the full spectral shift from a cold temperature (approximately minus 40 degrees Celsius) with an AOI at ten degrees to a hot temperature (80 degrees Celsius) at an AOI of zero degrees is five nanometers. If the silicon/niobium oxide is deposited on the polymeric substrate, the interference filter described in FIG. 8 reduce the full spectral width (i.e. FWHM) to 5 nanometers or less. When the full spectral shift is reduced to 5 nanometers or less, there is a much improved signal-to-noise ratio in which much of the solar spectrum is avoided and most of the solar photons are not transmitted through the interference filter.

Figure 13:
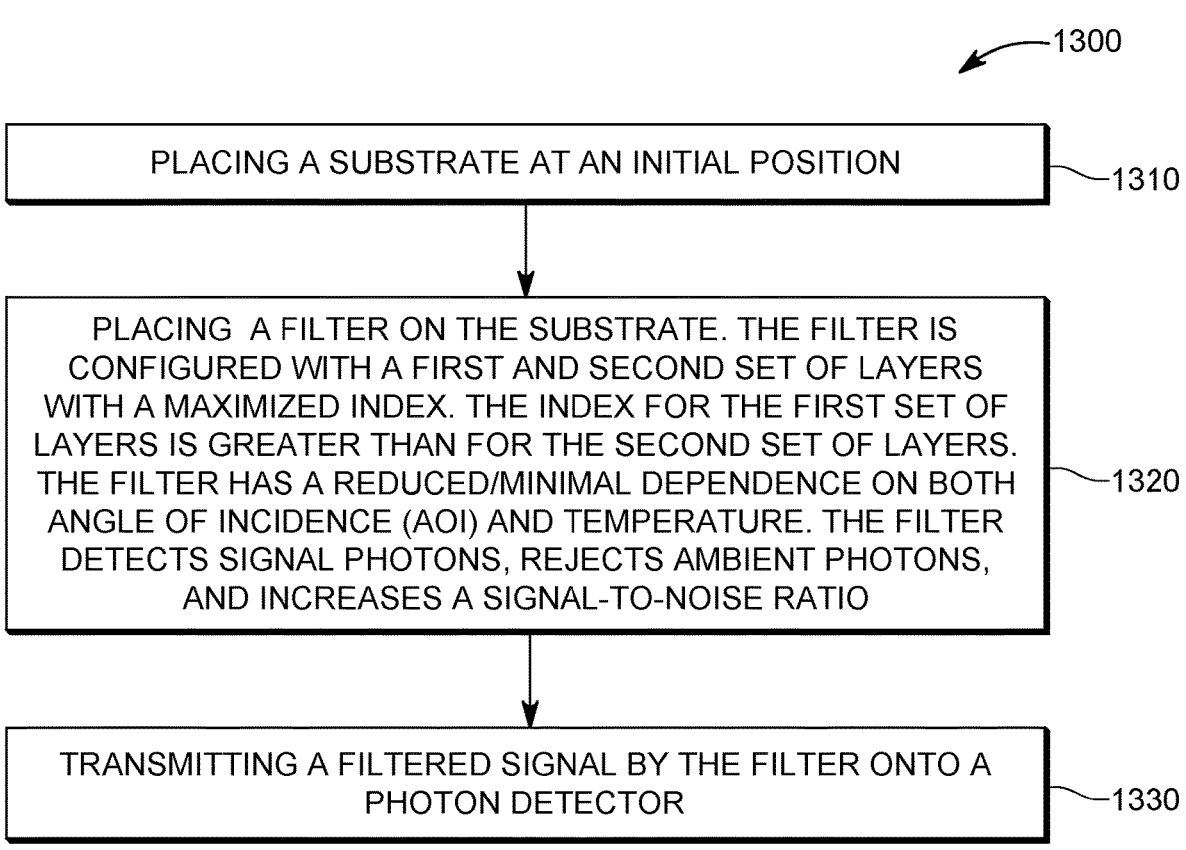
FIG. 13 illustrates a flowchart in accordance with an embodiment of the invention.

Referring to FIG. 13, a method 1300 is illustrated that shows the functioning of the interference filter. The interference filter is part of a system that is designed to have an interference filter with minimal AOI and thermal dependence. The type of materials deposited within the interference filter will ensure that the inference filter will have a reduced/minimal thermal and AOI dependence.

In FIG. 13, at step 1310, an initial substrate is placed at an initial position. The interference filter will eventually be placed on the substrate.

Referring to FIG. 13, at step 1320, an interference filter is placed onto the substrate. The interference filter is configured with a first set of layers and a second set of layers with a maximized index. The index for the first set of layers is greater than the index for the second set of layers. The first set of layers can be alternatively configured with the second set of layers. The interference filter has a reduced/minimal dependence on both the AOI and temperature (thermal dependence). The interference detects signal photons, and rejects ambient (solar photons). As the interference filter detects signal photons, there is an increased signal-to-noise ratio as a result. The materials in the interference filter and substrate enable the interference filter to have a reduced/minimal AOI and thermal dependence.

In FIG. 13, at step 1330, the interference filter will transmit a filtered signal onto a photon detector. The filtered signal will include signal photons, and wherein ambient (solar) photons will be mostly rejected by the interference filter. The photon detector can be positioned within a self-driving automobile. Overall, the photon detector will receive a filtered signal with minimal/reduced AOI and thermal dependence.

Those skilled in the art will appreciate that the example embodiments are non-exhaustive and that embodiments other than that described here may be included without departing from the scope and spirit of the presently disclosed embodiments.

Advantages

Overall, the inference filter described above provides the advantages of minimal dependence on the AOI and minimal thermal dependence. Materials with higher index values configured within the interference filter will enable the interference filter to have a minimal dependence on the AOI. The greater CTE of the substrate in comparison to the oxide layers and semiconductor layers will enable the interference filter to have minimal thermal dependence.

With respect to the AOI dependence, higher index materials such as silicon and germanium will be used to mediate the issue with the AOI. Moreover, hydrogenated amorphous silicon for both the high and low index layers will allow for high transmission at all AOI from zero to ten degrees. Interference filters that include silicon-based materials will thereby have a minimal AOI dependence.

In relation to the thermal dependence, substrates with a greater CTE than the oxide layers and semiconductor layers configured within the interference filter will be used. The contrast between the CTE of the substrate in comparison to the CTE of the oxide and semiconductor layers will minimize the thermal dependence of the interference filter. As such, the laser photons will be transmitted, and the signal-to-noise ratio will increase.

Accordingly, the laser photons will be transmitted onto a single photon detector or other detector. The detector can be positioned within a self-driving car or the like. As such, the self-driving car is able to perform the TOF sensing to detect the location and velocity of objects. The laser can be emitted from the self-driving car, reflected from objects, and then detected back at the car. The reflected laser photons are detected back at the self-driving car with an acceptable signal-to-noise ratio. Further, photons in a narrow band of wavelengths can be detected with high signal-to-noise ratios in other applications such as remote sensing and free-space communication systems.

CONCLUSION

All references, including granted patents and patent application publications, referred herein are incorporated herein by reference in their entirety.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Various aspects of the invention have been described above by way of illustration, and the specific embodiments disclosed are not intended to limit the invention to the particular forms disclosed. The particular implementation of the system provided thereof may vary depending upon the particular context or application. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

The corresponding structures, materials, acts, and equivalents of all means or step plus function elements in the claims below are intended to include any structure, material, or act for performing the function in combination with other claimed elements as specifically claimed.

The invention claimed is:

1. A method comprising:
positioning a substrate at an initial position;
placing a filter onto the substrate, wherein the filter is configured with a first set of layers with an index and a second set of layers with an index, wherein the index for the first set of layers is greater than the index for the second set of layers, wherein the filter has a reduced/minimal dependence on an angle of incidence (AOI), and reduced/minimal thermal dependence, wherein the filter detects signal photons, rejects ambient photons, and increases a signal-to noise ratio, wherein a temperature decrease increases compression of the filter to increase a thickness of the layers; and
transmitting a filtered signal by the filter onto a photon detector.

2. The method of claim 1, wherein the substrate has a greater coefficient of thermal expansion than the first and second set of layers.

3. The method of claim 1, further comprising:
Placing amorphous silicon or hydrogenated amorphous silicon layers within the first or second set of layers.

4. The method of claim 1, further comprising:
placing amorphous germanium or hydrogenated amorphous germanium layers within the first set of layers.

5. The method of claim 1, further comprising:
placing niobium oxide or titanium oxide layers within the second set of layers.

6. The method of claim 1, further comprising:
positioning a target object in front of the filter to reflect a signal onto the filter.

7. A method comprising:
positioning a substrate at an initial position;
configuring a filter with a plurality of layers onto the substrate, wherein the plurality of layers have an index, wherein one set of the plurality of layers have a greater index than another set of the layers, wherein the filter has a minimal dependence on an angle of incidence (AOI) and a minimal thermal dependence, wherein the filter is configured to detect signal photons and reject ambient photons and increase a signal to noise ratio;

increasing optical thickness in the filter with reduced temperature and decreasing the optical thickness in the filter with increased temperature to provide the reduced thermal dependence; and
transmitting a filtered signal from the filter toward one or more electronic devices.

8. The method of claim 7, further comprising:
providing amorphous silicon-germanium alloy or hydrogenated amorphous silicon-germanium alloy layers within one or more of the plurality of layers.

9. The method of claim 7, wherein the substrate is configured with a greater coefficient of thermal expansion (CTE) than the first and second set of layers.

10. The method of claim 7, wherein a coefficient of thermal expansion of the substrate is greater than a coefficient of thermal expansion of the filter.

11. The method of claim 7, wherein the filter is deposited within a sputtering-based system.

12. The method of claim 7, further comprising:
compressing the filter in response to a decrease in temperature.

13. A system comprising:
a substrate positioned at an initial position;
a filter configured onto the substrate, wherein the filter is configured with a first set of layers with an index and a second set of layers with an index, wherein the index for the first set of layers is greater than the index for the second set of layers, wherein the filter has a reduced/minimal dependence on an angle of incidence (AOI), and reduced/minimal thermal dependence, wherein the filter detects signal photons, rejects ambient photons, and increases a signal-to noise ratio, and wherein a temperature decrease increases compression of the filter to increase a thickness of the layers; and
a photon detector that receives a filter signal from the filter.

14. The system of claim 13, wherein germanium and silicon are provided as layers within the filter to enable the filter to have a reduced dependence on the AOI.

15. The system of claim 13, wherein the filter includes hydrogenated amorphous silicon or germanium.

16. The system of claim 13, wherein the compression of the filter is reduced in response to an increase in the temperature.

17. The system of claim 13, wherein a thickness of the filter is increased or decreased to reduce the thermal dependence of a band filter.

18. The system of claim 13, wherein the photon detector and interference filter are configured within a self-driving automobile, or a remote sensing satellite/drone, or a free-space communication system.

* * * * *